(12) United States Patent
Cho

(10) Patent No.: US 6,348,653 B1
(45) Date of Patent: Feb. 19, 2002

(54) APPARATUS FOR SHIELDING A PLASMA DISPLAY PANEL

(75) Inventor: Hae-woon Cho, Cheonan (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/593,474

(22) Filed: Jun. 14, 2000

(30) Foreign Application Priority Data

Jun. 30, 1999 (KR) .............................. 99-25806

(51) Int. Cl.[7] .................................................. H05K 9/00
(52) U.S. Cl. .............................. 174/35 MS; 174/35 R; 361/816; 313/479
(58) Field of Search .................... 174/35 R, 35 MS; 361/816, 818, 800; 454/184; 313/479

(56) References Cited

U.S. PATENT DOCUMENTS

| | | | | |
|---|---|---|---|---|
| 5,698,818 A | * | 12/1997 | Brench | ...................... 174/35 R |
| 6,002,584 A | * | 12/1999 | Messmer et al. | ........... 361/690 |
| 6,081,425 A | * | 6/2000 | Cheng | ......................... 361/704 |

* cited by examiner

Primary Examiner—Dean A. Reichard
Assistant Examiner—Hung V Ngo
(74) Attorney, Agent, or Firm—Leydig, Voit & Mayer, Ltd.

(57) ABSTRACT

An electromagnetic (EM) shield installed in a plasma display panel (PDP) case has layers arranged on top of another and with a gap between them. Each layer has heat dissipation apertures but the locations of the apertures are shifted from one layer to another for more completely shielding EM fields and yet allowing heat generated by a PDP circuit board to escape.

8 Claims, 3 Drawing Sheets

APPARATUS FOR SHIELDING A PLASMA DISPLAY PANEL

BACKGROUND OF THE INVENTION

1. Field of the Invention

The present invention relates to a plasma display panel (PDP) and in particular to a shield blocking electromagnetic field leakage from the PDP case and simultaneously allowing heat dissipation therethrough.

2. Description of the Related Art

A PDP, as shown in FIG. 1, displays an image when gas in its picture cells selectively becomes ionized under a certain voltage and thus generates ultraviolet light which collides with phosphor material 17 coating the walls 13 of the cells that emits visible light. The cells are defined by space between walls 13, between the front substrate 16 and rear substrate 10. In order to drive such a PDP high voltage driving signals are applied to electrodes 11, 14, and 15 embedded in dielectric layers 18 and 12 on the substrates 16 and 10 and a circuit board 30, disposed on the outside of the rear substrate as shown in FIGS. 2 and 3 and having a plurality of electrical/electronic elements such as semiconductor chips, resistors and capacitors, to take a few examples, generates the driving signals. Reference numeral 19 indicates a protective layer.

Because of a concern that electromagnetic field unavoidably generated from such circuits may be harmful to humans exposed to it, an electromagnetic (EM) shield 40 has been placed over the circuit board 30 to prevent EM fields from escaping from a case enclosing the electrical/electronic circuits. However, because electrical circuits also generate substantial heat, the shield must be removed for a proper operation of a device.

Conventionally a plurality of holes 41 were made in an EM shield as shown in FIG. 2 and FIG. 3 so that the heat can be dissipated through the holes. However, due to the provision of such holes 41 in the shield 40, sufficient protection against EM field leakage has not been possible.

SUMMARY OF THE INVENTION

It is an objective of the present invention to provide heat dissipation apertures in an EM Field shield and yet prevent leakage of EM through the apertures that would otherwise have happened.

In order to attain the objective, the present invention employs a multi-layered shield, where each of a plurality of preferably metal layers, spaced apart from each other, has apertures that are overlapped by shielding strips of an adjacent layer.

BRIEF DESCRIPTION OF THE DRAWING(S)

The above objective and advantages of the present invention will become more apparent by describing in detail a preferred embodiment thereof with reference to the attached drawings in which.

DESCRIPTION OF THE PREFERRED EMBODIMENT

Figure 1:
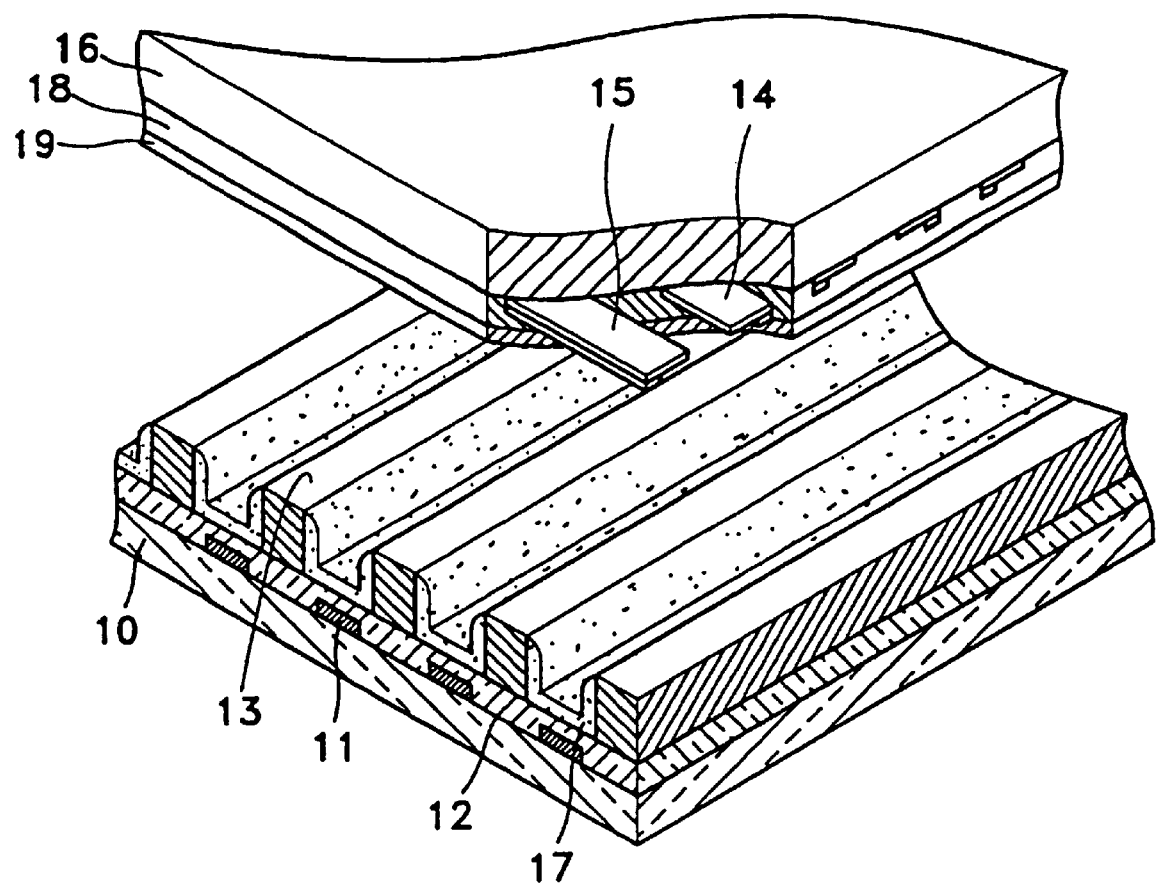
FIG. 1 is a conventional PDP.
Figure 2:
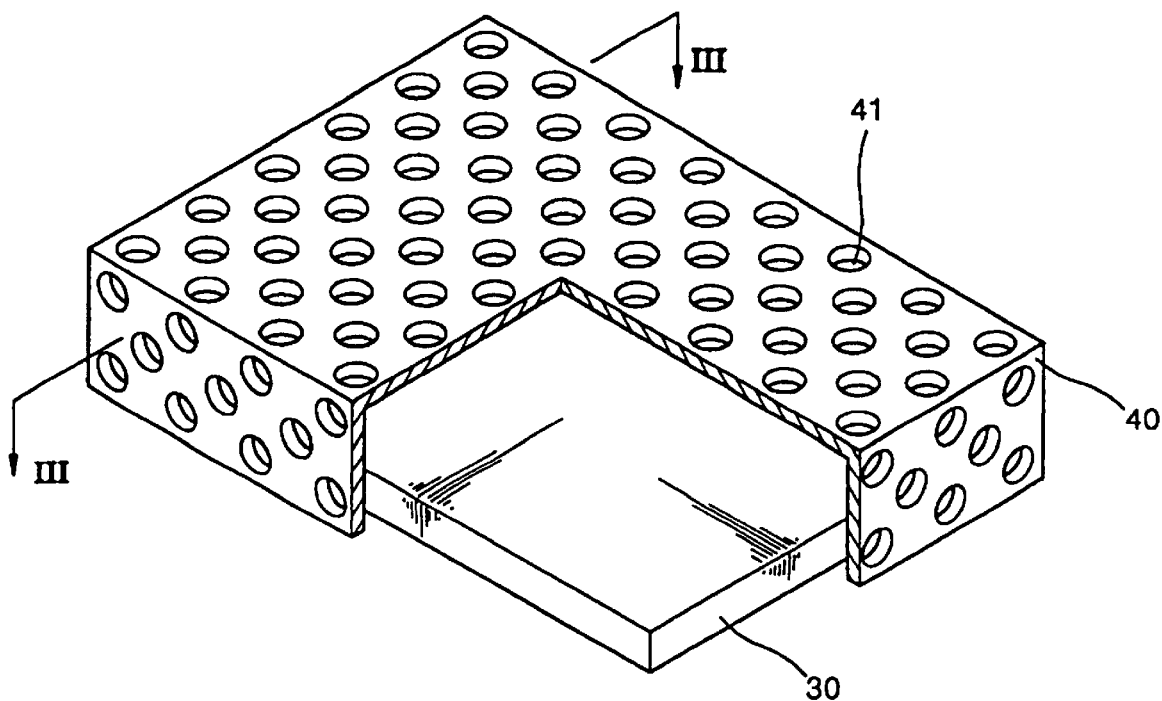
FIG. 2 is a conventional EM shield covering the PDP circuit board.
Figure 3:
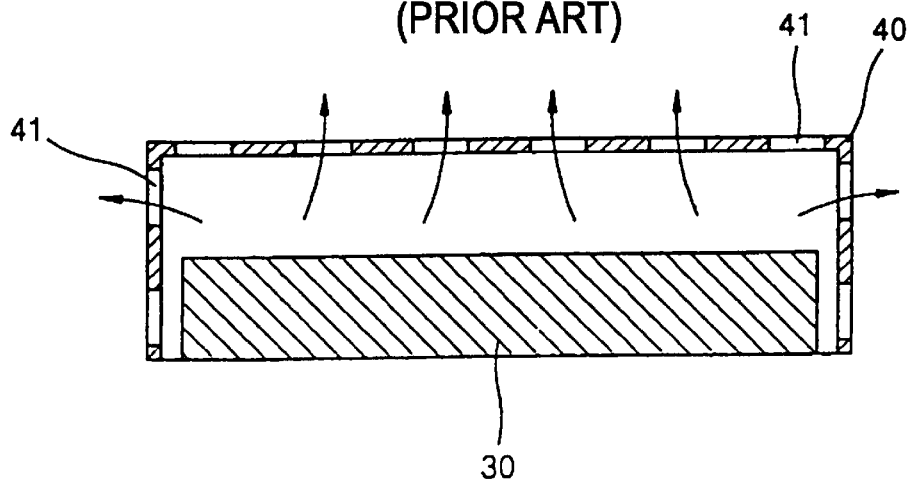
FIG. 3 is a cross section of a conventional EM shield along the line III—III of FIG. 2.
Figure 4:
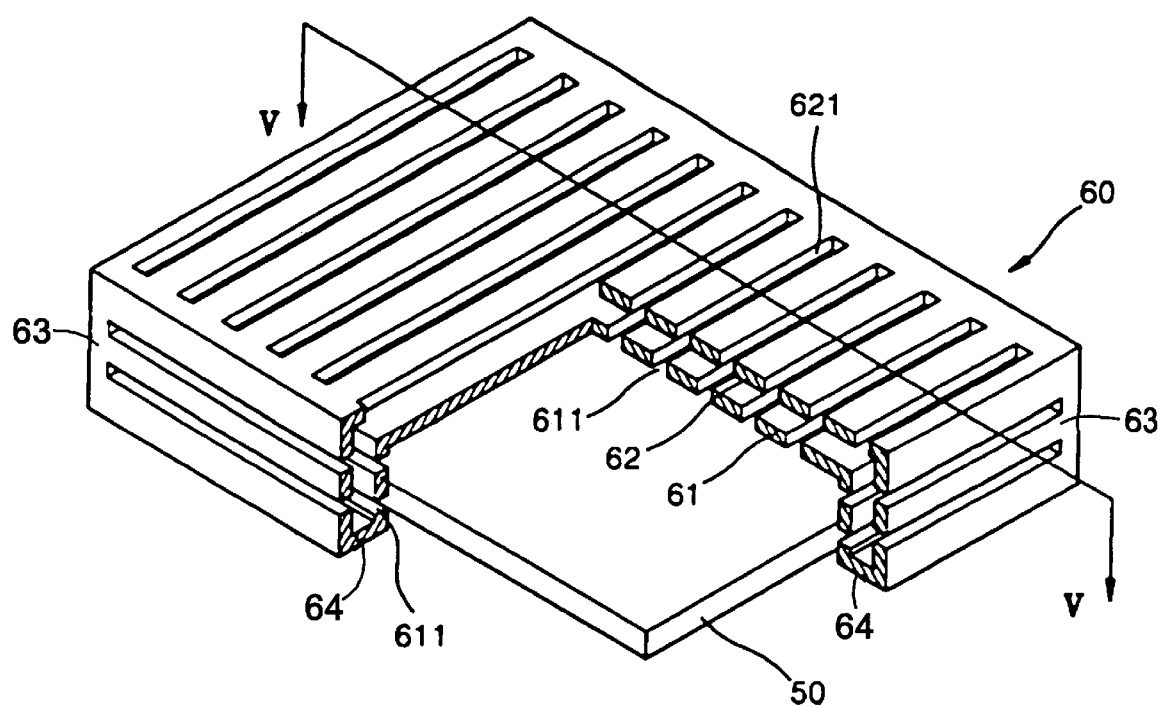
FIG. 4 is an EM shield according to the present invention.
Figure 5:
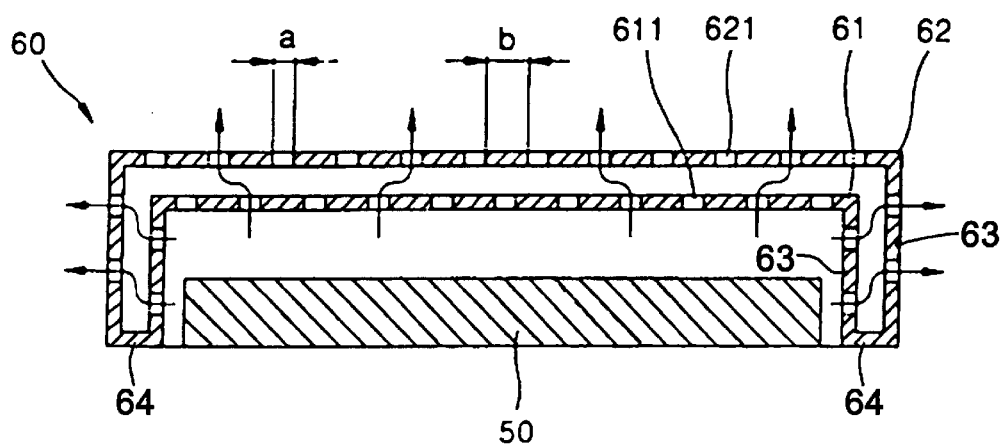
FIG. 5 is a cross section of an EM shield according to the present invention along the line V—V of FIG. 4.

Referring to FIGS. 4 and 5, the present invention will be described in detail. An EM shield 60 according to an embodiment of the present invention is a double layered open box-like structure which is laid over the circuit board 50 of a PDP. More than two layers can be used. Each layer is provided with a plurality of uniformly long slots arranged in parallel with each other, through which heat generated by the circuits in operation dissipates. The slot may be in a long rectangular shape. Therefore, the shielding portions between the slots also take the form of long strips with their ends connected to the periphery of the layer. In a double-layered structure, one layer 62 is disposed over the other layer 61 such that, when seen from a point normal to one side of the shield, the circuit board on the other side is not visible. The two layers are off axis in that the central axes normal to and passing through the centres of slots 611 of one layer do not coincide with those of the slots 621 in the other layer. More specifically, the width of shielding strips (b) is greater than the width (a) of the slots such that a shielding strip of a top layer completely overlaps a slot right below in the bottom layer, as illustrated in FIG. 5. Preferably the width (b) is twice that of the width (a). The two layers are single body in that the respective skirt/periphery portions 63 are joined by a bridge 64. Though the figures show that the skirt portion 63 of the shield are also double-layered, they may be single layered for better heat dissipation. In other words the sides of a flat bottom layer may have no skirt portion and be connected to the inner surface of the skirt portion 63 of the top layer. With an EM shield design of the present invention, an undesirable EM field generated from a PDP circuit board is more completely blocked from escaping the case while the heat generated is allowed through the apertures. The heat dissipation path is indicated by arrows and dissipated through the apertures. The heat dissipation path is indicated by arrows in FIG. 5. A material for the shield may be metal, preferably copper, because it is good at both heat transfer and shielding an EM field.

Experiments showed that a double-layered shield according to the present invention has improved em shielding characteristics reducing em leakage over the conventional single-layered shield by about 2 dB in the frequency range of 3–88 khz summarized in the table below.

| kHz | 0.1–3 | 0–10 | 0–30 | 0–88 | 8–100 |
|---|---|---|---|---|---|
| Single layer dBμV/m | 0 | 1 | 2 | 7 | 0 |
| Double layer dBμV/m | 0 | 0 | 0 | 5 | 0 |

What is claimed is:

1. An electromagnetic shield for electrical/electronic devices, comprising:

a first shield layer having a plurality of apertures, and a second shield layer having a plurality of apertures, wherein said first shield layer and said second shield layer are spaced apart and, non-aperture portions, between apertures of said first shield layer, are directly opposite apertures of said second shield layer, and the aperture and non-aperture portions of the first and second shield layers are arranged so that every line perpendicular to the first and second shield layers and passing through an aperture in one of the first and second shield layers intersects a non-aperture portion of the other of the first and second shield layers.

2. The electromagnetic shield as claimed in claim 1, wherein said first and second shield layers include respective surfaces and have respective peripheral skirt portions, transverse to the surfaces, and further including a bridge connecting the respective skirt portions.

3. The electromagnetic shield as claimed in claim 2, wherein said skirt portions have a plurality of apertures.

4. The electromagnetic shield as claimed in claim 1, wherein said first and second shield layers have respective surfaces and said first shield layer has a peripheral skirt portion transverse to the surfaces, and sides of said second shield layer are connected to an inner surface of said skirt portion.

5. The electromagnetic shield as claimed in claim 4, wherein said skirt portion has a plurality of apertures.

6. The electromagnetic shield as claimed in claim 1, wherein said apertures are rectangular slots and said non-aperture portions are strips.

7. The electromagnetic shield as claimed in claim 6, wherein said non-aperture portions have widths wider than widths of the rectangular slots.

8. The electromagnetic shield as claimed in claim 7, wherein the widths of said non-aperture portions are twice that of the rectangular slots.

\* \* \* \* \*